United States Patent [19]
Lattimore et al.

[11] Patent Number: 5,892,725
[45] Date of Patent: Apr. 6, 1999

[54] MEMORY IN A DATA PROCESSING SYSTEM HAVING UNEVEN CELL GROUPING ON BITLINES AND METHOD THEREFOR

[75] Inventors: George McNeil Lattimore, Austin, Tex.; Younes Lotfi, Colorado Springs, Colo.; Robert Anthony Ross, Jr., Cedar Park; Gus Wai-Yen Yeung, Austin, both of Tex.

[73] Assignee: International Business Machines Corporation, Armonk, N.Y.

[21] Appl. No.: 78,248

[22] Filed: May 13, 1998

[51] Int. Cl.⁶ ............................................. G11C 8/00
[52] U.S. Cl. .................................. 365/230.03; 365/63
[58] Field of Search .......................... 365/230.03, 63, 365/51, 149, 203

[56] References Cited

U.S. PATENT DOCUMENTS

| | | | |
|---|---|---|---|
| 4,558,241 | 12/1985 | Suzuki et al. | 307/530 |
| 4,845,675 | 7/1989 | Krenik et al. | 365/203 |
| 5,017,815 | 5/1991 | Shah et al. | 307/530 |
| 5,245,223 | 9/1993 | Lim et al. | 307/362 |
| 5,294,847 | 3/1994 | Grossman et al. | 307/530 |
| 5,479,371 | 12/1995 | Ootani | 365/200 |
| 5,761,146 | 6/1998 | Yoo et al. | 365/230.03 |
| 5,781,495 | 7/1998 | Arimoto | 365/230.03 |

*Primary Examiner*—Son T. Dinh
*Attorney, Agent, or Firm*—Barry S. Newberger; Winstead Sechrest & Minick P.C.; Anthony V. S. England

[57] ABSTRACT

A memory and a method for communicating therewith are implemented, the memory having a plurality of memory cell groups. Each memory cell group contains a plurality of memory cells. Memory cell groups within each subset of a plurality of subsets of memory cell groups include the same predetermined number of memory cells. During a read operation, a local bitline associated with the memory cell group from which data is being read is coupled to a global bitline. Other local bitlines, associated with the memory cell groups not being accessed during the read are decoupled from the global bitlines. Following a read, the local and global bitlines are restored by a precharge operation.

24 Claims, 9 Drawing Sheets

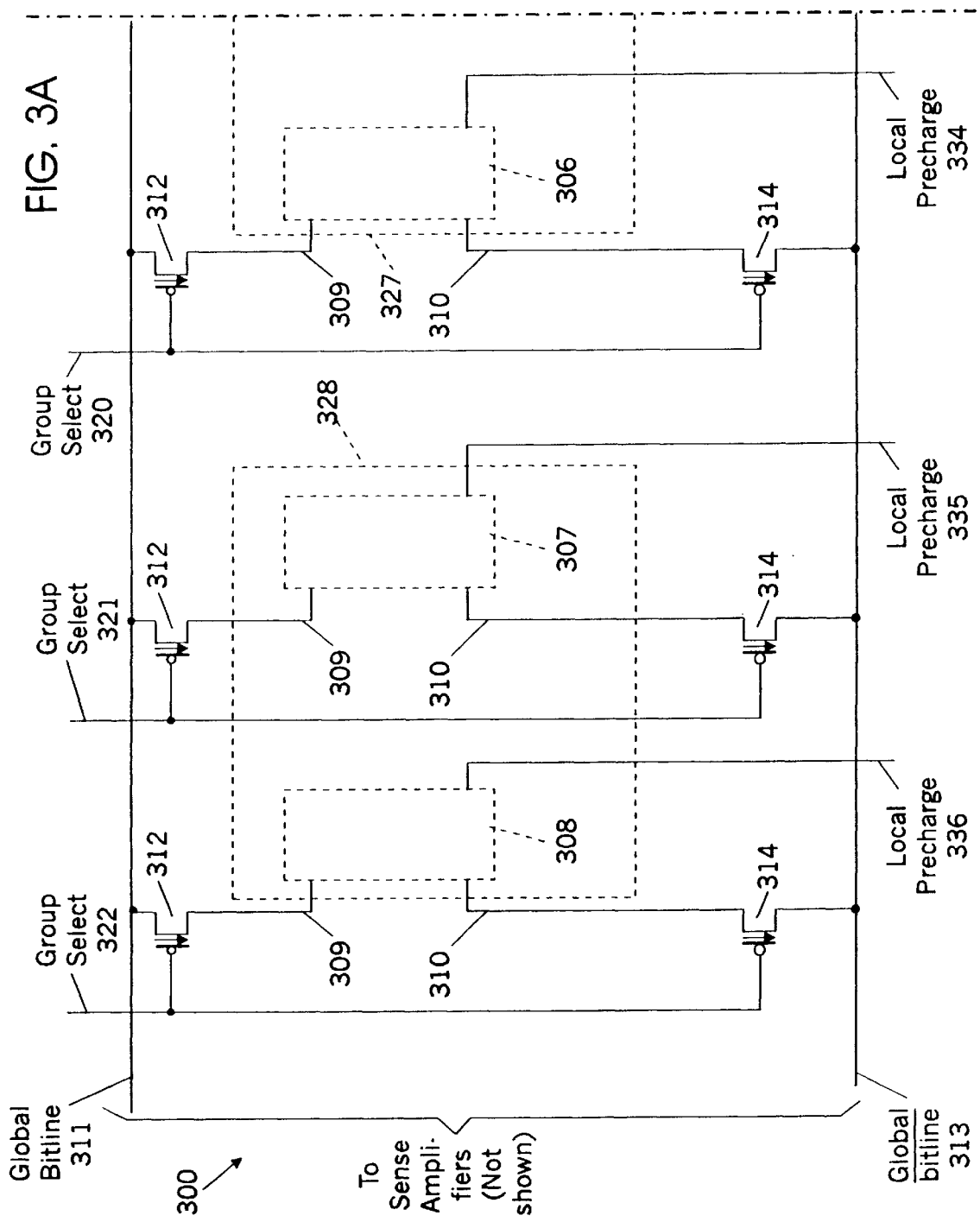

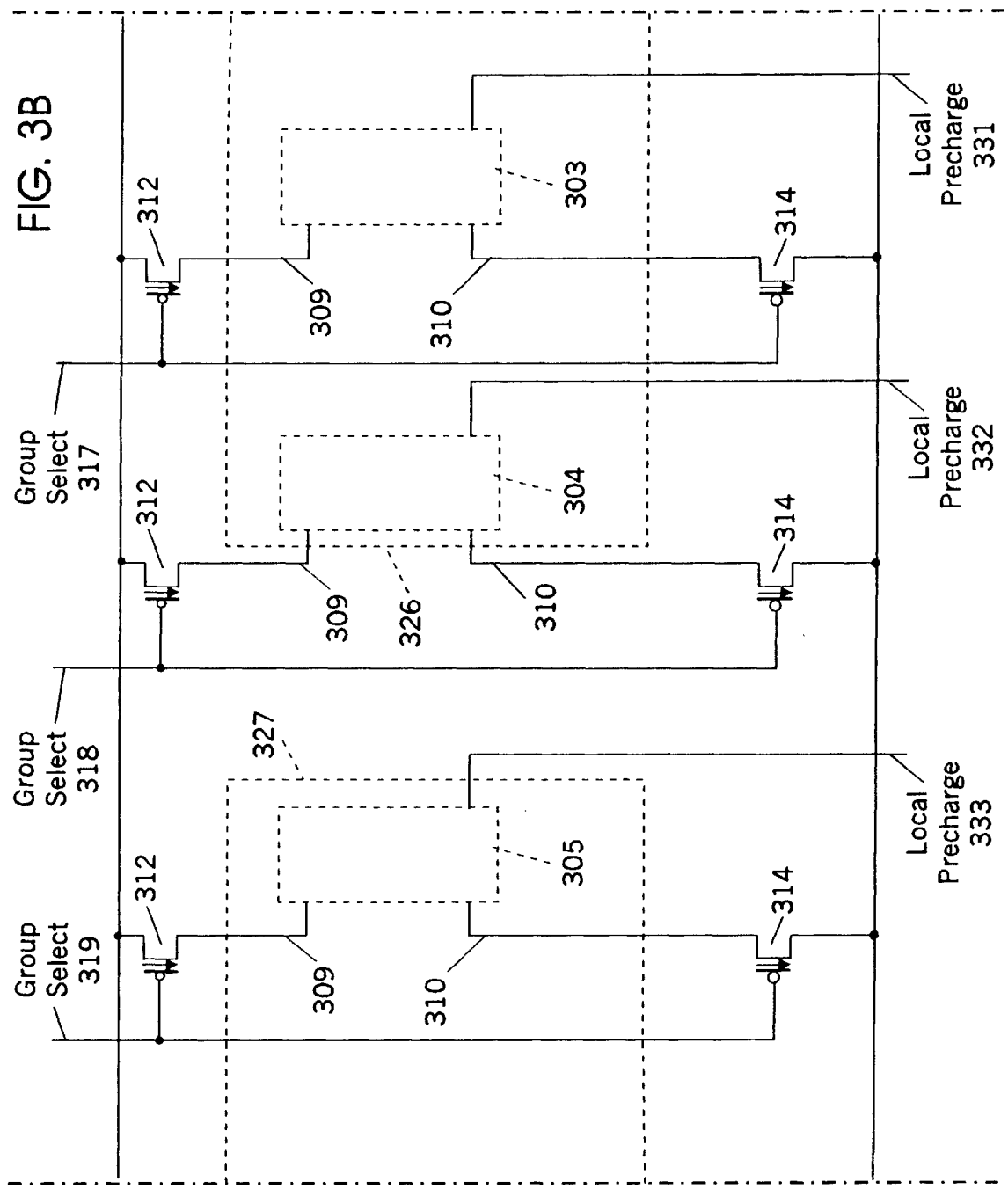

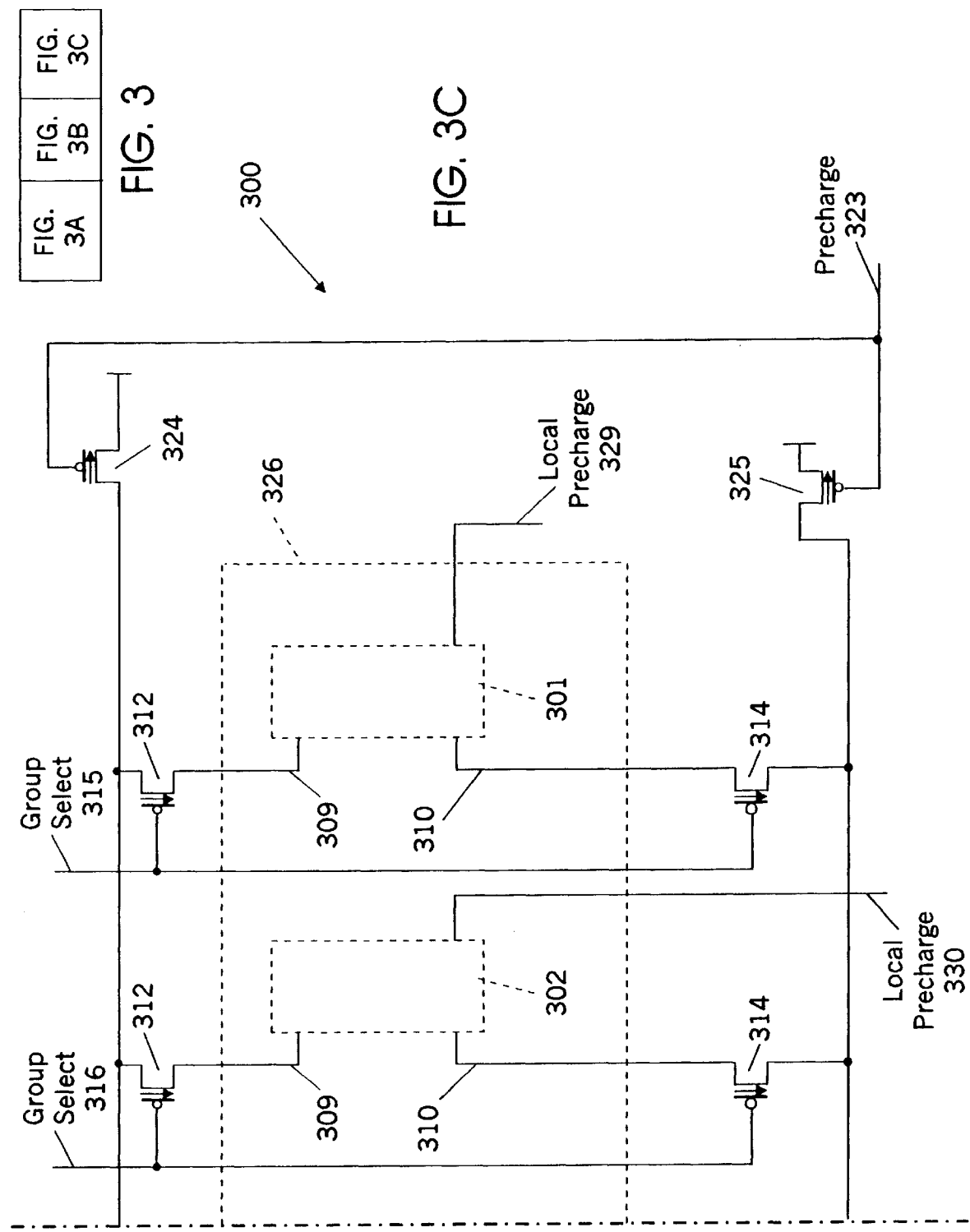

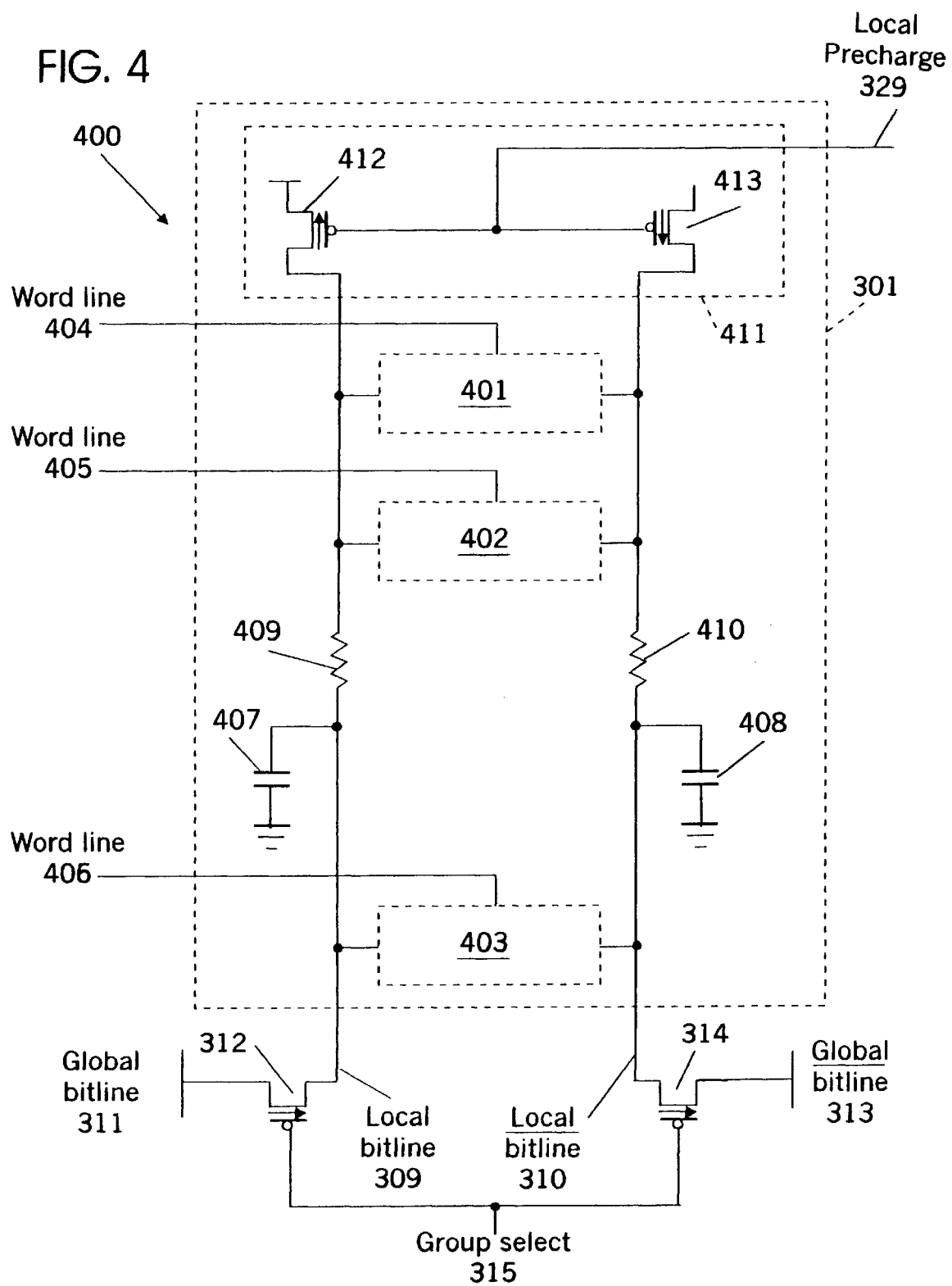

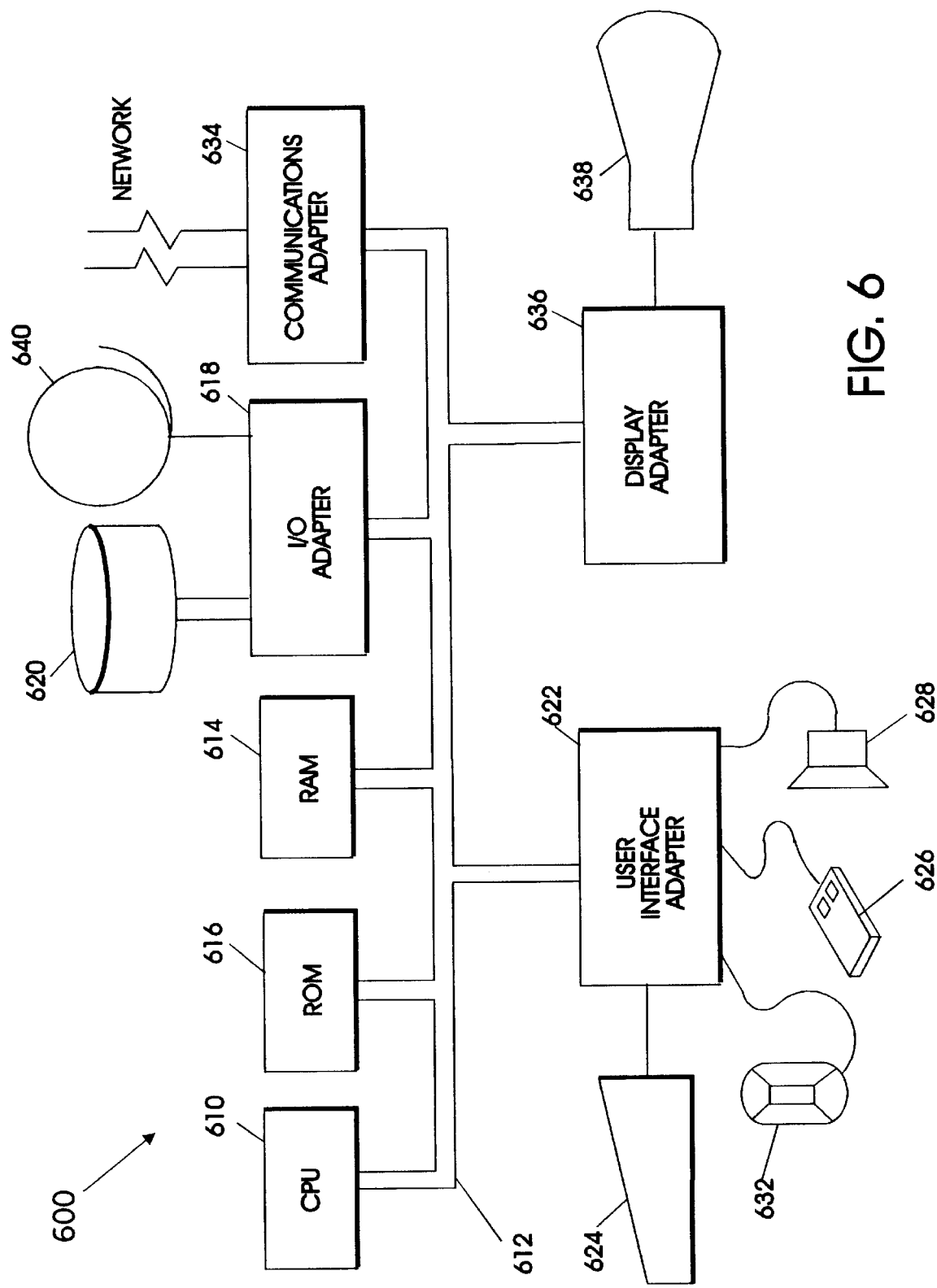

MEMORY IN A DATA PROCESSING SYSTEM HAVING UNEVEN CELL GROUPING ON BITLINES AND METHOD THEREFOR

CROSS-REFERENCE TO RELATED APPLICATIONS

Related subject matter may be found in the following commonly assigned, co-pending U.S. Patent Applications, each of which are hereby incorporated by reference herein:

Ser. No. 09/140,368 (AT9-98-037), entitled "A MEMORY ARRAY HAVING A UNIDIRECTIONAL BUS AND METHOD THEREFOR" and filed Aug. 26, 1998; and Ser. No. 09/082,540 (AT9-97-320), entitled "A MEMORY IN A DATA PROCESSING SYSTEM HAVING IMPROVED PERFORMANCE AND METHOD THEREFOR" and filed May 21, 1998;

Ser. No. 08/904,987 (AT9-97-311), entitled "BIT LINE DOMINO BOOST AMPLIFIER" and filed Aug. 1, 1997.

TECHNICAL FIELD

The present invention relates in general to data processing systems, and in particular, to memory in data processing systems.

BACKGROUND INFORMATION

In memory designs, the read access time is the sum of delay times from three sources. These are the delays from address to row and column select, the delay from row select to a differential signal developing on the bitline, and the delay from the appearance of a signal differential on the bitlines to the output.

Referring to FIG. 1, there is depicted therein a single bitline column 100, having a plurality of cells, of which four, cells 101–104 are shown. Bitline 105, and its complement, bitline 106 are precharged by precharge circuit 107. During a precharge phase, precharge signal 108 is asserted, turning on p-type metal oxide semiconductor (PMOS) devices 109–111. PMOS devices 109 and 110 couple bitline 105 and bitline 106 to a voltage source. PMOS device 111 equalizes the charge on bitline 105 and bitline 106.

Precharge circuit 107 must precharge bitline capacitances 112 and 113 through bitline resistances 114 and 115. Bitline capacitances 112 and 113 represent the wire capacitances of the bitlines themselves as well as the capacitances associated with the memory cells on the bitline. These capacitances have been represented by lump capacitances 112 and 113, however, it would be understood that these capacitances are distributed along a length of bitline 105 and bitline 106, respectively. Similarly, resistances associated with bitline 105 and bitline 106 have been shown in FIG. 1 as lumped resistances 114 and 115, respectively, however, it would be understood that these resistances are distributed along the length of bitline 105 and bitline 106. The precharge time is determined by the "RC" time constant of the bitline resistances and the bitline capacitances.

During a read operation, data stored in one of memory cells 101–104 are transferred to the bitlines. Precharge signal 108 is negated, turning off PMOS devices 109–111 and precharge circuit 107, thereby decoupling bitline 105 and bitline 106 from the voltage source. Bitline 105 and bitline 106 are discharged to create a voltage differential across the bitlines. The voltage differential is transferred to the data lines, data 116 and data 117 through PMOS device 118 and PMOS device 119, respectively. During the read, PMOS devices 118 and 119 are turned on by asserting read select 120. The rate at which a differential is developed across bitline 105 and bitline 106, and consequently, data 116 and data 117 depends on the capacitances 112 and 113, and resistances 114 and 115, on the bitlines.

As memory increases in size, thereby increasing the number of cells on a bitline column, such as bitline column 100, bitline capacitance increases proportionately as bitline lengths increase to accommodate additional cells, as well as from added cell capacitance. Therefore, the read and precharge times increase because of the increase in capacitance associated with capacitances 112 and 113. Hence, there is a need in the art for a mechanism which improves the read access time by enhancing the rate at which a differential read signal is developed on a pair of bitlines, on a memory bitline column.

SUMMARY OF THE INVENTION

The previously mentioned needs are addressed by the present invention. Accordingly, there is provided in a first form, a memory system includes a first and second memory cell group. Each of the first and second memory cell groups include a plurality of memory cells wherein a number of memory cells in the first memory cell group is useful to a number of memory cells in the second memory cell group. The memory system further includes a first bitline coupled to the first memory cell group. The first bitline is adapted for coupling to a second bitline for communicating read data thereto. A third bitline is coupled to the second memory cell group. The third bitline is adopted for coupling to the second bitline for communicating read data thereto.

Additionally, there is provided, in a second form, a method of communicating with a memory. For a read operation, a first bitline connected to a first memory cell group is coupled to a second bitline in response to a signal for selecting the first memory cell group. A third bitline coupled to a second memory cell group is decoupled from the second bitline.

There is provided in a third form a data processing system having a processor, a memory system, and an input/output system. The memory system includes a plurality of memory cells partitioned into first and second memory cell groups. A first bitline coupled to the first memory cell group and a second bitline is coupled to the second memory cell group. A third bitline is adopted for coupling to the first and second bitlines for reading from the first and second memory cell groups, respectively. The first memory cell group contains a number M of memory cells and the second memory cell group contains a number N of memory cells that is unequal to M.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 illustrates a memory bitline column in accordance with the principles of the present invention;

FIG. 4 illustrates a memory cell group in accordance with an embodiment of the present invention;

FIG. 6 illustrates, in block diagram form, a data processing system in accordance with one embodiment of the present invention.

DETAILED DESCRIPTION

Figures 1, 1A:
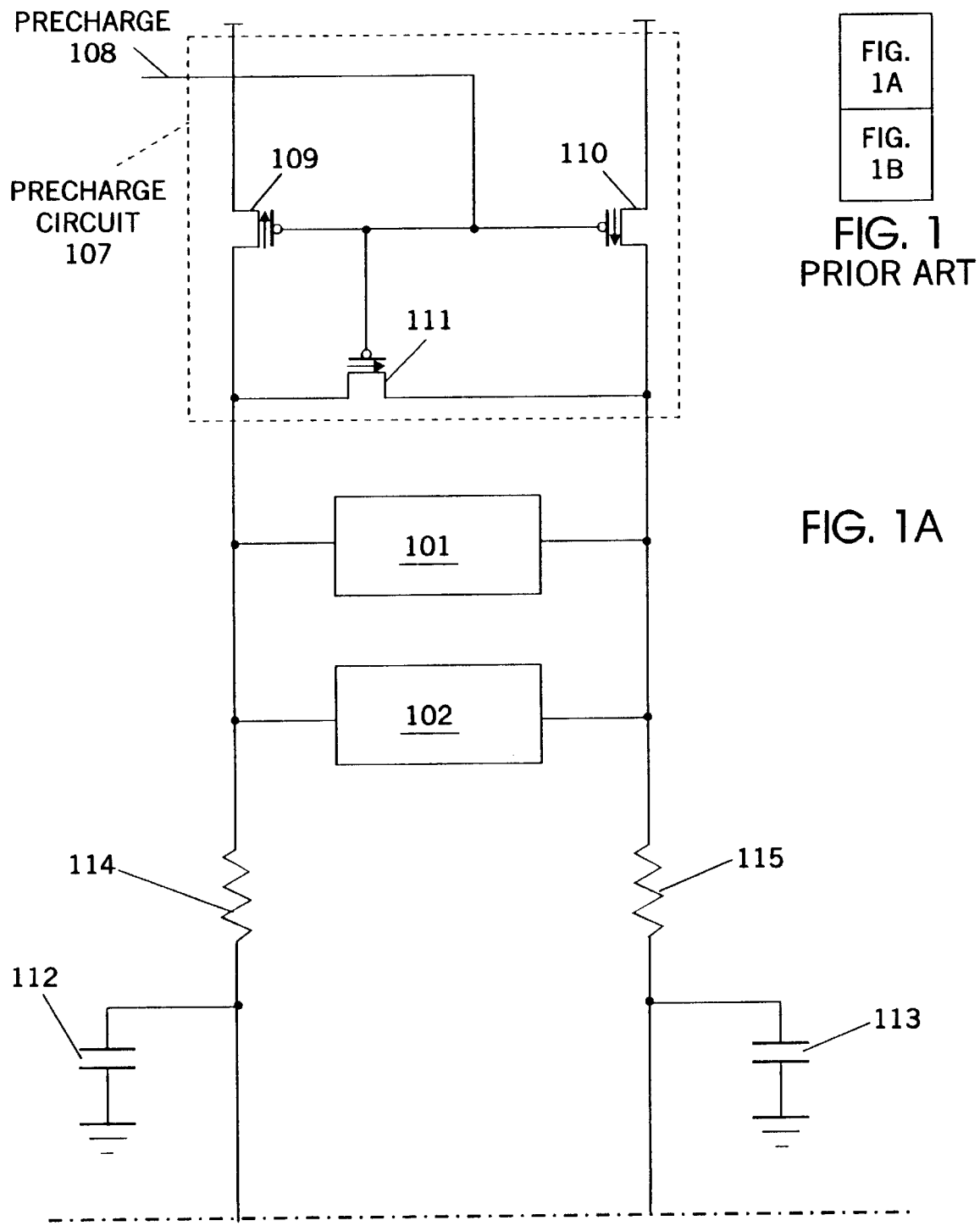
FIG. 1 illustrates a memory bitline column in accordance with the prior art.
Figure 1B:
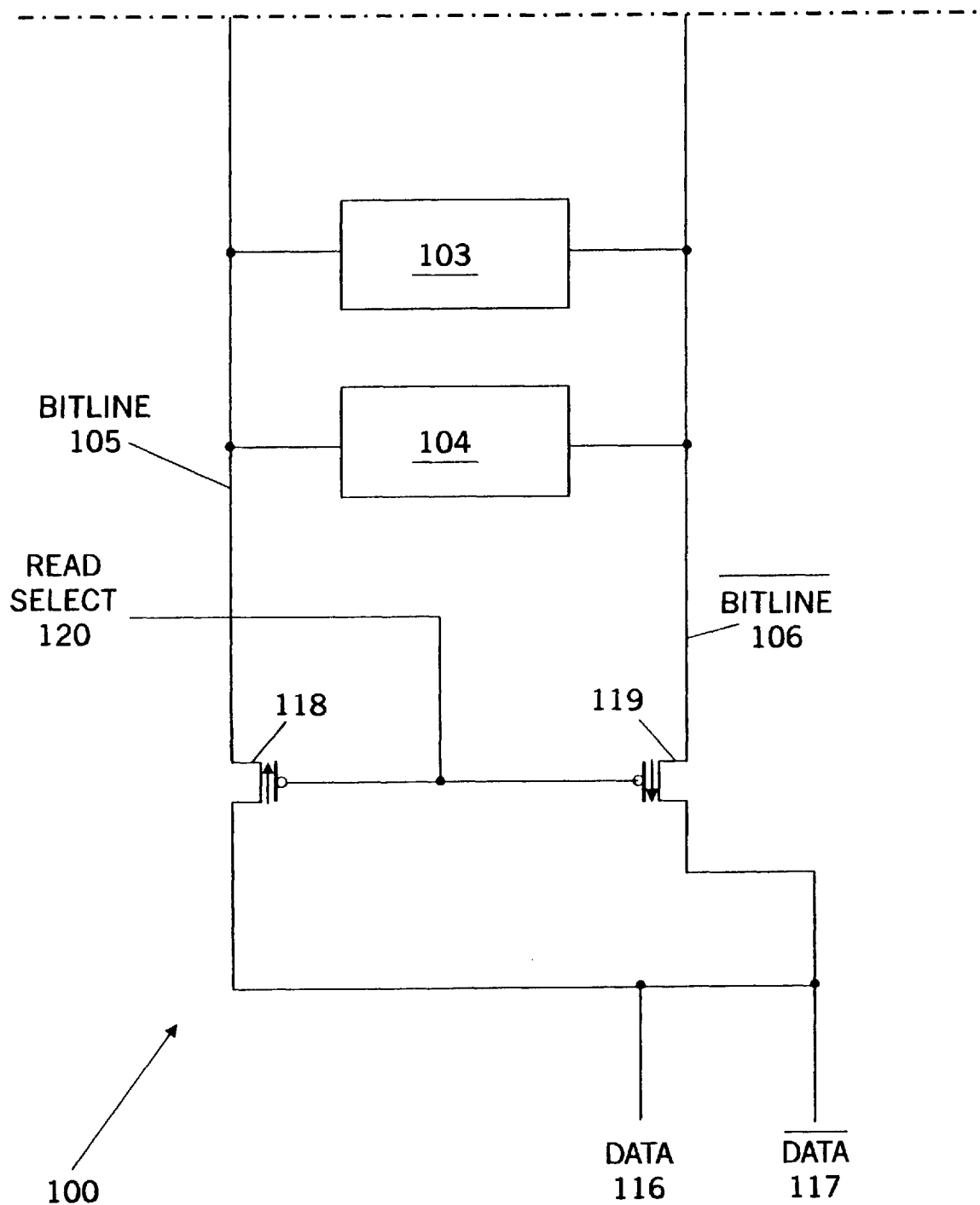

The present invention reduces the read access time for a memory by increasing the rate at which a differential signal is developed on a bitline pair in a memory bitline column. According to the principles of the present invention, the memory cells on a bitline pair are segmented into groups of cells resident on a second, local bitline pair. Local bitlines are coupled to global bitlines through word switches. In this way, during a read operation, the bitline capacitance which must be discharged in order to establish a voltage differential on a bitline pair is reduced, thereby reducing the memory read time.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art. Furthermore, during a description of the implementation of the invention, the terms "assert" and "negate" and various grammatical forms thereof, are used to avoid confusion when dealing with the mixture of "active high" and "active low" logic signals. "Assert" is used to refer to the rendering of a logic signal or register bit into its active, or logically true, state. "Negate" is used to refer to the rendering of a logic signal or register bit into its inactive, or logically false, state.

Refer now to the drawings wherein depicted elements are not necessarily shown to scale and wherein like or similar elements are designated by the same reference numeral through the several views.

Figure 2:
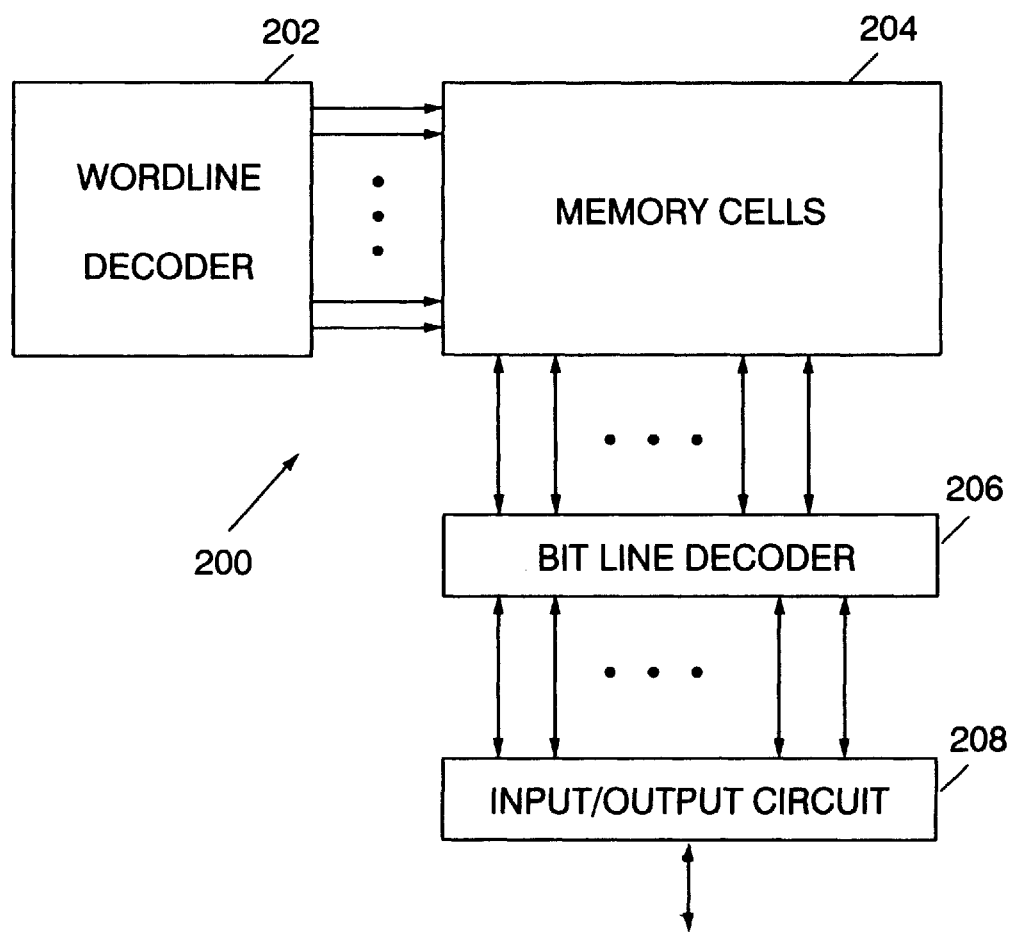
FIG. 2 illustrates, in block diagram form, a memory system in accordance with one embodiment of the present invention.

FIG. 2 illustrates a memory system 200 in accordance with one embodiment of the present invention. Note that the memory system of the present invention may be implemented in RAM 614 (FIG. 6), ROM 616 (FIG. 6), or a cache (not shown) of data processing system 600 (FIG. 6) or another memory device not illustrated in detail therein.

Memory system 200 comprises a wordline decoder 202, a plurality of memory cells 204, a bitline decoder 206, and an input/output circuit 208. Wordline decoder 202 is coupled to memory cells 204 to provide a plurality of decoded data. Additionally, bitline decoder 206 is coupled to the plurality of memory cells 204 to communicate data which has been decoded or will be decoded. Input/output circuit 208 is coupled to bitline decoder 206 to communicate data with bitline decoder 206 and to determine a value which corresponds to that data.

A portion of memory system 200, memory bitline column 300, according to the principles of the present invention is illustrated in FIG. 3. In memory bitline column 300, memory cells are grouped in eight memory cell groups, 301–308. Each of memory cell groups 301–308 contain a plurality of memory cells (not shown in FIG. 3). A number of memory cells in each of memory cell groups 301–308 may be different from cell group to cell group. This will subsequently be discussed in further detail.

Each of memory cell groups 301–308 are served by local bitline pairs, local bitline 309 and local $\overline{\text{bitline}}$ 310. Each of local bitlines 309 is coupled to global bitline 311 by a corresponding PMOS device 312. Likewise, each of local $\overline{\text{bitlines}}$ 310 is coupled to a complementary global bitline, global $\overline{\text{bitline}}$ 313 by a corresponding PMOS device 314. PMOS devices 312 and 314 are controlled by group select signals 315–322, corresponding to memory cell groups 301–308, respectively.

Prior to a read operation, bitlines are precharged by asserting precharge signal 323. Global bitline 311 is coupled to a voltage source through PMOS device 324 in response thereto. Similarly, global $\overline{\text{bitline}}$ 313 is coupled to the voltage source through PMOS device 325. Circuitry (not shown in FIG. 3) precharges local bitlines 309 and local $\overline{\text{bitlines}}$ 310 in response to precharge signals asserted on local precharge lines 329–336. Local bitlines 309 and local $\overline{\text{bitlines}}$ 310 may be precharged in response to precharge 323 by coupling (not shown) local precharge 329–336 to precharge 323. Alternatively, each of local bitlines 309 and local $\overline{\text{bitlines}}$ 310 may be independently precharged by asserting one of local precharge 329–336 for the respective memory cell group 301–308 associated to the local bitlines to be precharged.

During a read operation, only local bitlines associated with the memory cell group containing the memory cell from which the read is to take place are coupled to the global bitlines. A corresponding one of group select signals 315–322 is asserted, thereby turning associated ones of PMOS devices 312 and 314. This couples the corresponding one of local bitlines 309 to global bitline 311, and the corresponding one of local $\overline{\text{bitlines}}$ 310 to global $\overline{\text{bitline}}$ 313. The remaining ones of group select signals 315–322 are negated, decoupling the associated local bitlines from global bitline 311 and global $\overline{\text{bitline}}$ 313. Therefore, the capacitances associated with the memory cells within each of the unselected groups, do not appear on the global bitlines, global bitline 311 and global $\overline{\text{bitline}}$ 313. The time required to develop a voltage differential on a bitline pair is thereby reduced.

The memory cell from which the read is taking place only experiences the device capacitances associated with the memory cells within its respective group. Because the other memory cells are decoupled from the global bitline pair, the read cell does not need to discharge the capacitances associated with those memory cells not within its corresponding memory cell group. The voltage differential developed between the corresponding local bitline 309 and local $\overline{\text{bitline}}$ 310 is transferred to global bitline 311 and global $\overline{\text{bitline}}$ 313 by the corresponding PMOS devices 312 and 314.

Further understanding of a memory bitline column according to the principles of the present invention may be had by referring to FIG. 4 in which is depicted a portion 400 of memory bitlines column 300 of FIG. 3. Portion 400 includes a memory cell group, cell group 301, according to the present invention. Memory cell group 301 has been, for simplicity, shown to include three memory cells 401–403. It would be understood, however, that memory cell group 301 may include any predetermined number of memory cells. Each of memory cells 401–403 is coupled to local bitline 309 and local bitline 310.

During a read from one of cells 401–403, the cell from which the read is to take place is selected by the corresponding wordline 404–406. The one of cells 401–403 from which the read is occurring, must discharge the capacitance associated with local bitline 309 and local bitline 310, shown as lumped capacitances 407 and 408, respectively in FIG. 4, but understood to be distributed in a physical bitline. The time necessary to establish a voltage differential across local bitline 309 and local bitline 310 is determined by the "RC" time constant formed from capacitances 407 and 408, respectively discharged through bitline resistances 409 and 410, also shown as lumped resistances in FIG. 4. As previously discussed, bitline capacitances 407 and 408 are associated only with the wire capacitances of local bitline 409 and local bitline 310, and the device capacitances associated with memory cells 401–403.

Local bitline 309 and local bitline 310 are coupled to global bitline 311 and bitline 313 by PMOS devices 312 and 314, respectively. Global bitline 311 and global bitline 313 have wire capacitances associated with them, but, as discussed in conjunction with FIG. 3, there are no other device capacitances shunting the global bitline pair. Thus, although the differential voltage appearing across local bitline 309 and local bitline 310 divides between capacitances 407 and 408, and the wire capacitances of global bitline 311 and global bitline 313 (not shown), the voltage division is increased because of the reduced capacitance associated with global bitline 311 and global bitline 313.

Prior to a write operation, local bitline 309 and local bitline 310 are precharged through bitline precharge circuit 411. Bitline precharge circuit 411 includes a pair of PMOS devices, PMOS device 412 and PMOS device 413. Gates of PMOS devices 412 and 413 receive local precharge 329. During precharge, local precharge 329 is asserted, thereby turning on PMOS devices 412 and 413, coupling local bitline 309 and local bitline 310, respectively, to a voltage source. Following precharge, during a read operation, local precharge 329 is negated, turning off PMOS devices 412 and 413, decoupling local bitline 309 and local bitline 310 from the voltage source.

During a read, the divided differential voltage appearing across global bitline 311 and global bitline 313 also develops during a time period determined by an "RC" time constant. This time constant depends on the global bitline capacitances, constituting the wire capacitances of the global bitline pair 311 and 313, and the wire resistance of the pair. As previously described, these are distributed along the length of the global bitline 311 and global bitline 313. A memory read occurs when the voltage differential on global bitline 311 and global bitline 313 appears at the input to a sense amplifier (not shown) on the bitline pair. Referring again to FIG. 3, memory cell group 301, which is farthest from bitline sense amplifiers (not shown) associated with memory bitline column 300 will experience a greater "RC" delay for the development of a differential voltage across global bitline 311 and global bitline 313 (not shown) at the sense amplifier (not shown) than will memory cell group 308 which is closer to the sense amplifier and therefore experiences a shorter "RC" time constant. In other words, there is a propagation delay along the length of the bitline pair 311 and 313 associated with discharging the distributed capacitance along the pair.

The difference in the time delays among memory cell groups associated with the global bitline pair, global bitline 311 and global bitline 313, can be compensated for by varying the number of memory cells in each of memory cell groups 301–308. In this way, an uneven grouping of memory cells gives rise to a varying signal development time for each local bitline pair associated with memory cell groups 301–308, respectively, due to the different numbers of memory cells. Greater or fewer cells respectively give rise to more or less capacitance on local bitline pairs 300 and 310. By including more memory cells in memory cell groups closer to the sense amplifiers (not shown), the increase signal development time on the local bitline pairs associated with those cells may offset the shorter time delay associated with the global bitline pairs. That is, the number of memory cells within memory cell groups such as 301, and 302 may be less than the number of cells included in memory cell groups such as memory cell group 307 and memory cell group 308. In this way, an overall read time delay for memory cell groups near a top of memory bitline column 308 may be made comparable to the overall read time delay for memory cell groups near a bottom of memory bitline column 300. In this way, the uneven bitline grouping gives a rise to memory read times that are comparable over a bitline column, such as memory bitline column 300.

Figure 5:
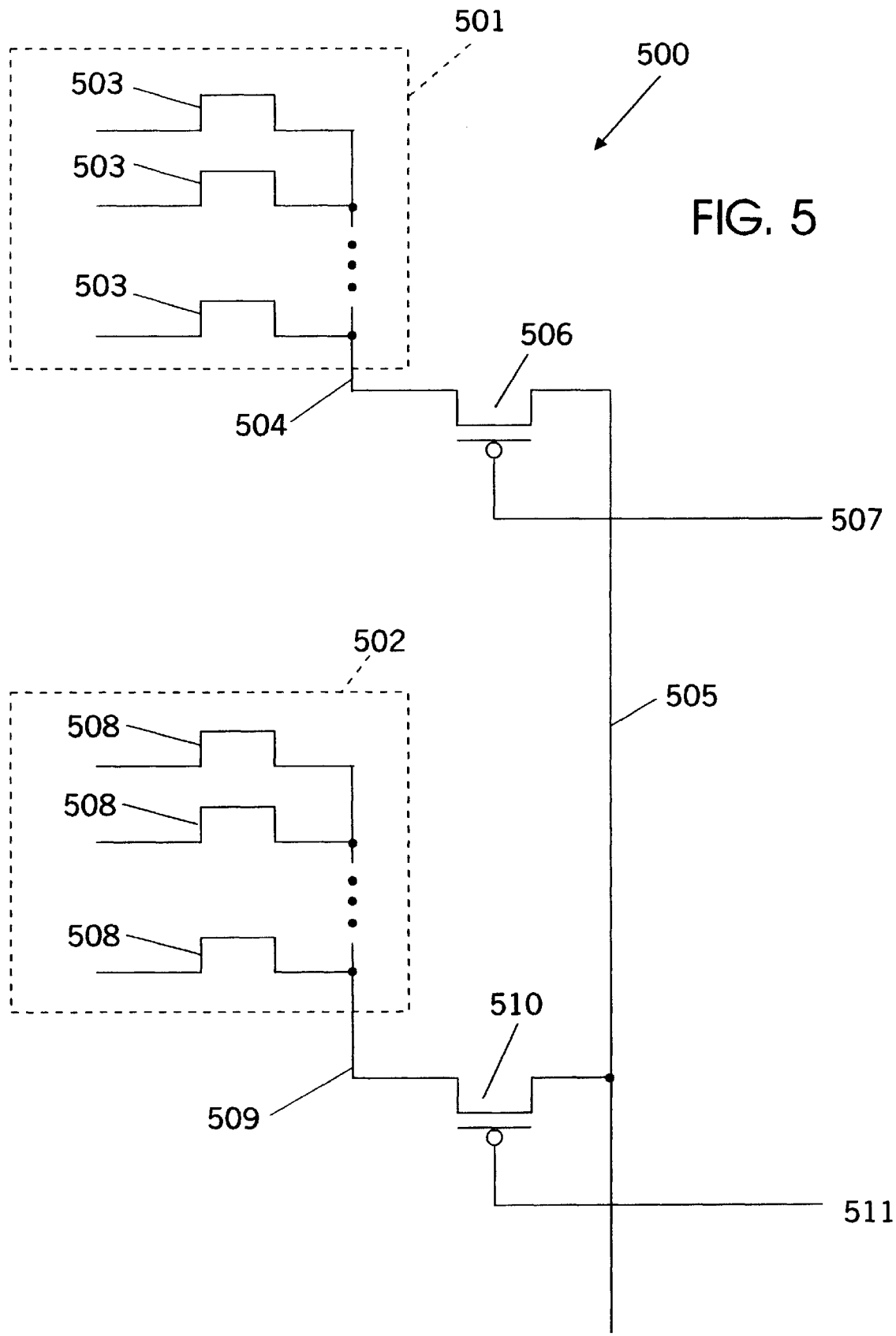
FIG. 5 illustrates, in schematic form, a portion of a bitline column, in accordance with an embodiment of the present invention.

The uneven grouping of memory cells may be further understood by referring to FIG. 5 in which is illustrated portion 500 of a bitline. Bitline portion 500 includes two memory cell groups 501 and 502. Each of memory cell groups 501 and 502 contain a plurality of memory cells (not shown in their entirety), wherein a number of memory cells in memory cell group 501 is not equal to a number of memory cells in memory group 502.

Memory cell group 501 includes a first plurality, M, of n-type metal oxide semiconductor (NMOS) devices 503. NMOS devices 503 form a part of M memory cells (not shown in their entirety) in memory cell group 501. NMOS devices 503 are coupled to local bitline 504. Local bitline 504 is further coupled to global bitline 505 through PMOS device 506. Coupling is effected in response to a first group select signal, signal 507, provided to a gate of PMOS device 506. Group select signal 507 is asserted during a read from one of the memory cells in memory cell group 501.

Similarly, memory cell group 502 includes a second plurality, N, of NMOS devices 508. NMOS devices 508 form a part of N memory cells (not shown in their entirety) in memory cell group 502. The number of cells, N, in memory cell group 502 and the number of cells, M, in memory group 501 are unequal. NMOS devices 508 are coupled to local bitline 509. Local bitline 509 is further coupled to global bitline 505 through PMOS device 510. Coupling is effected in response to a second group select signal, signal 511 provided to a gate of PMOS device 510. Group select signal 511 is asserted during a read from one of the memory cells in memory cell group 502.

In an embodiment of the present invention, each memory cell group, such as memory cell groups 301–308 in memory bitline column 300 of FIG. 3, may have differing numbers of memory cells. For example, a first subset 326 of memory cell groups 301–308 may have a first number of memory cells in each memory cell group within the subset. A second subset 327 of memory cell groups may have a second number of memory cells in each of the memory cell groups in the second subset, and yet a third subset 328 of memory cell groups may have a third number of memory cells in each of the memory cell groups in the third subset. For example, in an embodiment of the present invention having 512 cells in memory bitline column 300, and eight memory cell groups 301–308, memory cell groups 301–304 may each include 32 memory cells. The remaining 384 cells may be partitioned such that memory cell groups 305 and 306 each contain 64 memory cells, and memory cell groups 307 and 308 each contain 128 memory cells. It would be understood that other combinations of memory cells within memory cell groups, and memory cell groups within a memory bitline column are within the scope of the principles of the present invention. It also would be understood that the partitioning of memory cells into subsets of memory cell groups may be accomplished to make the overall read time comparable along the bitline column, insofar as practicable with a discrete number of memory cells and memory cell groups.

Referring now to FIG. 6, an example is shown of a data processing system 600 which may be used for the invention. The system has a central processing unit (CPU) 610, such as a PowerPC microprocessor ("PowerPC" is a trademark of IBM Corporation) according to "The PowerPC Architecture: A Specification for a New Family of RISC Processors", 2d edition, 1994, Cathy May, et al. Ed., which is hereby incorporated herein by reference. A more specific implementation of a PowerPC microprocessor is described in the "PowerPC 604 RISC Microprocessor Users Manual", 1994, IBM Corporation, which is hereby incorporated herein by reference. The history buffer (not shown) of the present invention is included in CPU 610. The CPU 610 is coupled to various other components by system bus 612. Read only memory ("ROM") 616 is coupled to the system bus 612 and includes a basic input/output system ("BIOS") that controls certain basic functions of the data processing system 600. Random access memory ("RAM") 614, I/O adapter 618, and communications adapter 634 are also coupled to the system bus 612. I/O adapter 618 may be a small computer system interface ("SCSI") adapter that communicates with a disk storage device 620. Communications adapter 634 interconnects bus 612 with an outside network enabling the data processing system to communication with other such systems. Input/Output devices are also connected to system bus 612 via user interface adapter 622 and display adapter 636. Keyboard 624, track ball 632, mouse 626 and speaker 628 are all interconnected to bus 612 via user interface adapter 622. Display monitor 638 is connected to system bus 612 by display adapter 636. In this manner, a user is capable of inputting to the system throughout the keyboard 624, trackball 632 or mouse 626 and receiving output from the system via speaker 628 and display 638. Additionally, an operating system such as AIX ("AIX" is a trademark of the IBM Corporation) is used to coordinate the functions of the various components shown in FIG. 6.

Although the present invention and its advantages have been described in detail, it should be understood that various changes, substitutions and alterations can be made herein without departing from the spirit and scope of the invention as defined by the appended claims.

What is claimed is:

1. A memory system comprising:
   a first memory cell group including a first plurality of memory cells, said first memory cell group coupled to a first bitline;
   a second memory cell group including a second plurality of memory cells, said second memory group coupled to a second bitline, wherein said first and second bitlines are adapted for coupling to a third bitline for communicating read data thereto, and wherein a first number of memory cells in said first plurality of memory cells is unequal to a second number of memory cells in said second plurality of memory cells.

2. The memory system of claim 1 further comprising a third memory cell group including the first number of memory cells, said third memory cell group coupled to a fourth bitline.

3. The memory system of claim 2 further comprising a fourth memory cell group including the second number of memory cells, said fourth memory cell group coupled to a fifth bitline, wherein said fourth and fifth bitlines are adapted for coupling to said third bitline for communicating read data thereto.

4. The memory system of claim 1 wherein said first bitline is adapted for coupling to said third bitline in response to a first signal, and said second bitline is adapted for coupling to said third bitline in response to a second signal.

5. The memory system of claim 1 further comprising:
   a fourth bitline coupled to said first memory cell group, wherein a signal on said fourth bitline is a logical couplement of a signal on said first bitline;
   a fifth bitline coupled to said second memory all group, wherein a signal on said fifth bitline is a logical complement of a signal on said second bitline, and wherein said fourth and fifth bitlines are adapted for coupling to a sixth bitline for communicating read data thereto.

6. The memory of claim 1 wherein each said first bitline is coupled to a source of a p-type metal oxide semiconductor device, a drain of said device being coupled to said third bitline, and a gate of said device receiving a signal for selecting said first memory group.

7. The memory system of claim 1 wherein said second bitline is coupled to a source of a p-type metal oxide semiconductor device, a drain of said device being coupled to said third bitline, and a gate of said device receiving a signal for selecting second memory cell group.

8. The memory of claim 1 further comprising a first precharge device coupled to said plurality of first bitlines, said first precharge device coupling a voltage source to said plurality of first bitlines in response to a precharge signal.

9. The memory system of claim 1 further comprising:
   a wordline decoder coupled to each of said memory cells; and
   a bitline decoder coupled to said third bitline.

10. A method of communicating data for a read operation in a memory system comprising the steps of:
   coupling a first bitline associated with a first memory cell group to a second bitline, said coupling in response to a signal for selecting said memory cell group from a plurality of memory cell groups; and
   decoupling a third bitline associated with a second memory cell group from said second bitline, wherein said first and second memory cell groups each contain a plurality of memory cells, said plurality in said first memory cell group and said plurality in said second memory cell group having unequal numbers of cells.

11. The method of claim 10 further comprising the step of precharging said first and second bitlines to a first preselected voltage value.

12. The method of claim 11 wherein said step of precharging said first and second bitlines is in response to a precharge signal.

13. The method of claim 11 further comprising, for a read operation, the step of discharging said first and second bitlines to a second preselected voltage value in response to a data value in a memory cell in said first memory cell group.

14. The method of claim 10 further comprising, after a read operation, decoupling said first bitline from said second bitline.

15. The method of claim 12 further comprising the step of coupling a fourth bitline associated with said first memory cell group to a fifth bitline, said coupling in response to said signal for selecting said memory cell group from a plurality of memory cell groups.

16. The method of claim 15 further comprising the step of precharging said fourth and fifth bitlines to a first preselected voltage value.

17. The method of claim 16 further comprising, for a read operation, the step of discharging said fourth and fifth bitlines to a second preselected voltage value in response to a data value in a memory cell in said memory cell group.

18. The method of claim 15 further comprising, after a read operation, decoupling said fourth bitline from said fifth bitline.

19. A data processing system comprising:
a processor coupled via a bus to a storage system, a memory system, and an input/output system, wherein a memory system is located within one of said processor, storage system, memory system, or input/output system, said memory system further comprising:
a plurality of memory cells wherein said plurality of memory cells is partitioned into first and second memory cell groups;
a first bitline coupled to said first memory cell group;
a second bitline coupled to said second memory cell group;
a third bitline adapted for coupling to said first and second bitlines for communicating read data from said first and second memory cell groups, and wherein a number M of memory cells in said first memory cell group is unequal to a number N of memory cells in said second memory cell group.

20. The data processing system of claim 19 wherein said first bitline is coupled to said third bitline by a first switching device and said second bitline is coupled to said third bitline by a second switching device.

21. The data processing system of claim 19 wherein said first bitline is coupled to said third bitline in response to a first signal and said second bitline is coupled to said third bitline in response to a second signal.

22. The data processing system of claim 21 wherein said first and second signals are sent to first and second switching devices, respectively, said first switching device coupling said first and third bitlines, and said second switching device coupling said second and third bitlines.

23. The data processing system of claim 19 wherein said memory system further comprises a precharge circuit coupled to said first, second and third bitlines.

24. The data processing system of claim 19 wherein said memory system further comprises:
a fourth bitline coupled to said first memory cell group, a signal on said fourth bitline being a logical complement of a signal on said first bitline, said fourth bitline being adapted for coupling to a fifth bitline for communicating read data from said first memory cell group; and
a sixth bitline coupled to said second memory cell group, a signal on said sixth bitline being a logical complement of a signal on said second bitline, said sixth bitline being adapted for coupling to said fifth bitline for communicating read data from said second memory cell group.

* * * * *